(12) United States Patent
Bourez

(10) Patent No.: US 8,137,517 B1
(45) Date of Patent: Mar. 20, 2012

(54) DUAL POSITION DC MAGNETRON ASSEMBLY

(75) Inventor: Allen Bourez, San Jose, CA (US)

(73) Assignee: WD Media, Inc., San Jose, CA (US)

( * ) Notice: Subject to any disclaimer, the term of this patent is extended or adjusted under 35 U.S.C. 154(b) by 471 days.

(21) Appl. No.: 12/368,951

(22) Filed: Feb. 10, 2009

(51) Int. Cl.
*C23C 14/56* (2006.01)
*C23C 14/35* (2006.01)

(52) U.S. Cl. ......... 204/298.12; 204/298.16; 204/298.21

(58) Field of Classification Search ............ 204/298.12–204/298.13, 298.16–298.17, 298.21–298.22
See application file for complete search history.

(56) References Cited

U.S. PATENT DOCUMENTS

| | | |
|---|---|---|
| 4,597,847 A | 7/1986 | Boys |
| 4,604,180 A | 8/1986 | Hirukawa et al. |
| 4,647,361 A | 3/1987 | Bauer |
| 4,714,536 A | 12/1987 | Freeman et al. |
| 4,995,958 A | 2/1991 | Anderson et al. |
| 5,126,029 A | 6/1992 | Tomer et al. |
| 5,174,880 A | 12/1992 | Bourez et al. |
| 5,200,049 A | 4/1993 | Stevenson et al. |
| 5,215,638 A | 6/1993 | Hausler |
| 5,252,194 A | 10/1993 | Demaray et al. |
| 5,512,150 A | 4/1996 | Bourez et al. |
| 5,645,699 A | 7/1997 | Sieck |
| 5,685,959 A | 11/1997 | Bourez et al. |
| 5,736,020 A | 4/1998 | Lal et al. |
| 5,795,451 A | 8/1998 | Tan et al. |
| 5,879,523 A | 3/1999 | Wang et al. |
| 5,968,328 A | 10/1999 | Teschner et al. |
| 6,024,843 A | 2/2000 | Anderson et al. |
| 6,033,483 A | 3/2000 | Demaray et al. |
| 6,139,695 A | 10/2000 | Washburn et al. |
| 6,228,236 B1 | 5/2001 | Rosenstein et al. |
| 6,258,217 B1 | 7/2001 | Richards et al. |
| 6,277,250 B1 | 8/2001 | Russell et al. |
| 6,322,679 B1 | 11/2001 | De Bosscher et al. |
| 6,365,010 B1 | 4/2002 | Hollars |
| 6,406,599 B1 | 6/2002 | Subramani et al. |
| 6,413,382 B1 | 7/2002 | Wang et al. |
| 6,610,184 B2 | 8/2003 | Ding et al. |
| 6,841,050 B2 | 1/2005 | Hong et al. |
| 6,852,202 B2 | 2/2005 | Miller et al. |
| 7,018,515 B2 | 3/2006 | Gung et al. |
| 7,119,489 B2 | 10/2006 | Shin et al. |
| 7,169,271 B2 | 1/2007 | Hong et al. |
| 7,182,843 B2 | 2/2007 | Stelter et al. |
| 7,208,878 B2 | 4/2007 | Shin et al. |
| 2005/0103620 A1 | 5/2005 | Chistyakov |
| 2005/0236267 A1 | 10/2005 | Rich |
| 2007/0227881 A1 | 10/2007 | Gaertner et al. |
| 2008/0060938 A1 | 3/2008 | Miller et al. |

OTHER PUBLICATIONS

U.S. Appl. No. 12/419,257, filed Apr. 6, 2009, 28 pages.
Office Action dated Jan. 6, 2012 in U.S. Appl. No. 12/419,257 22 pages.

*Primary Examiner* — Mark F Huff
*Assistant Examiner* — John S Ruggles

(57) ABSTRACT

A sputtering system includes a first sputtering assembly configured to sputter material onto a first disk and a second sputtering assembly configured to sputter material onto a second disk, the second sputtering assembly positioned proximate the first sputtering assembly. The first sputtering assembly includes a first magnetic ring, and the second sputtering assembly includes a second magnetic ring. The first magnetic ring includes a first region of lower relative magnetic strength positioned near the second magnetic ring, and the second magnetic ring includes a second region of lower relative magnetic strength positioned near the first magnetic ring.

15 Claims, 5 Drawing Sheets

DUAL POSITION DC MAGNETRON ASSEMBLY

BACKGROUND

A variety of equipment may be used in the manufacture of disk drive media to form the different magnetic and non-magnetic layers. In a typical process, a glass or aluminum substrate travels sequentially through a number of stations at which different materials are deposited under different conditions. For example, one or more sputtering systems may be used to sputter magnetic and/or non-magnetic materials onto the media.

In conventional sputtering processes, active sputtering stations for the media must be separated by relatively large distances. Without such separation, electromagnetic interference might occur between the stations and result in inhomogeneous sputtering or even equipment failure. Thus, the sputtering stations are physically separated, or, if closely situated, the sputtering stations may not be not used concurrently. Indeed, in some sputtering systems, sputtering components may be shared between adjacent sputtering stations and may be moved back and forth between them as the active sputtering station changes.

Unfortunately, such separation (whether physical or temporal) may result in increased capital expenditure, wasted manufacturing floor space and/or slower throughput. There is therefore a need for an improved sputtering system having at least two sputtering locations proximate one another.

DETAILED DESCRIPTION

Figure 1:
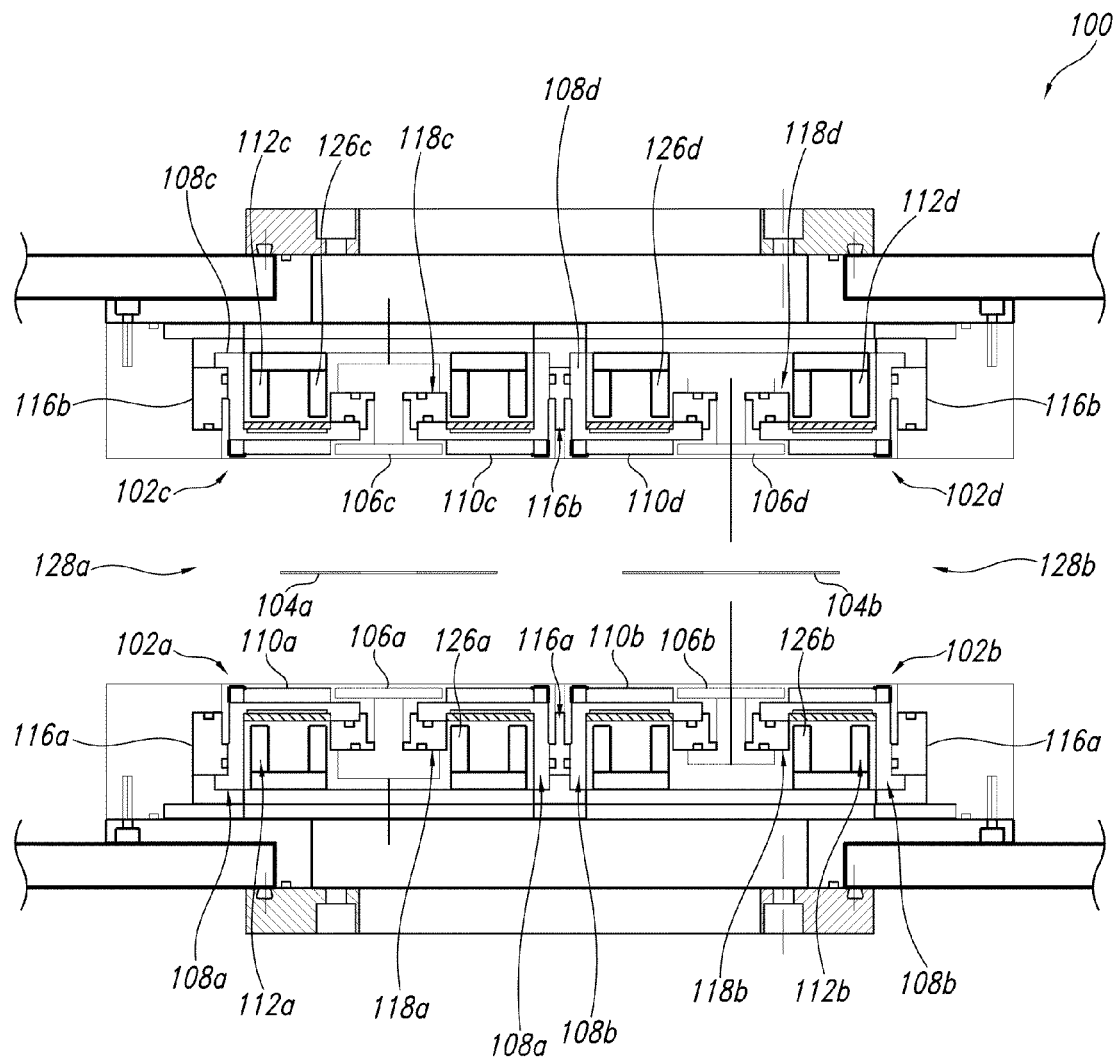
FIG. 1 is a cross-sectional, schematic view illustrating an exemplary sputtering system including two disks in corresponding sputtering locations, according to one embodiment.

Referring to FIG. 1, an exemplary sputtering system 100 is illustrated, according to one embodiment. The sputtering system 100 includes a first sputtering assembly 102a configured to sputter material onto a first disk 104a and a second sputtering assembly 102b configured to sputter material onto a second disk 104b. As illustrated, the second sputtering assembly 102b is positioned proximate the first sputtering assembly 102a. The first sputtering assembly 102a may include a first anode 106a, a first cathode 108a, a first target 110a coupled to at least one of the first anode 106a and the first cathode 108a, and a first magnetic ring 112a. Meanwhile, the second sputtering assembly 102b may include a second anode 106b, a second cathode 108b, a second target 110b coupled to at least one of the second anode 106b and the second cathode 108b, and a second magnetic ring 112b. In one embodiment, the first magnetic ring 112a includes a first region 114a of lower relative magnetic strength positioned near the second magnetic ring 112b, and the second magnetic ring 112b includes a second region 114b of lower relative magnetic strength positioned near the first magnetic ring 112a.

The sputtering system 100 may comprise any of a variety of systems configured to sputter materials in different environments. The sputtering system 100 may be configured for RF, DC or pulsed-DC magnetron sputtering. In other embodiments, other sputtering methods may be implemented in the sputtering system 100. In one embodiment, as illustrated, the sputtering system 100 includes two sputtering locations at which disks 104a, b may be positioned within a sealed chamber. In other embodiments, the sputtering system 100 may include three or more sputtering locations for accommodating greater numbers of disks or other media.

As illustrated, the sputtering system 100 is configured to sputter materials onto a pair of magnetic disks 104a, b, and the methods described herein will be described in terms of such a system. Such magnetic disks 104a, b may comprise the media used in conventional disk drives, and may include any of a variety of magnetic and non-magnetic materials deposited onto a substrate (e.g., glass or aluminum). However, the methods and components described herein may also be applied to and/or implemented in other sputtering systems, including, e.g., systems used to sputter materials onto optical and magneto-optical disks or onto differently shaped substrates used in other environments.

In one embodiment, the sputtering system 100 may further comprise a third sputtering assembly 102c configured to sputter material onto the first disk 104a and a fourth sputtering assembly 102d configured to sputter material onto the second disk 104b. As illustrated, the third sputtering assembly 102c is positioned opposite the first sputtering assembly 102a, and the fourth sputtering assembly 102d is positioned opposite the second sputtering assembly 102b. The third sputtering assembly 102a may include a third anode 106c, a third cathode 108c, a third target 110c coupled to at least one of the third anode 106c and the third cathode 108c, and a third magnetic ring 112c. Similarly, the fourth sputtering assembly 102d may include a fourth anode 106d, a fourth cathode 108d, a fourth target 110d coupled to at least one of the fourth anode 106d and the fourth cathode 108d, and a fourth magnetic ring 112d. In one embodiment, the third magnetic ring 112c includes a third region of lower relative magnetic strength positioned near the fourth magnetic ring 112d, and the fourth magnetic ring 112d includes a fourth region of lower relative magnetic strength positioned near the third magnetic ring 112c.

Thus, in one embodiment, the sputtering system 100 may include substantially identical pairs of sputtering assemblies 102a-d positioned opposite one another. As illustrated, these sputtering assemblies 102a-d may be configured such that both sides of the first and second disks 104a, b may be sputtered substantially concurrently. However, in other embodiments, the sputtering system 100 may be configured to sputter onto only one side of the disks 104a, b at a time.

Figure 2:
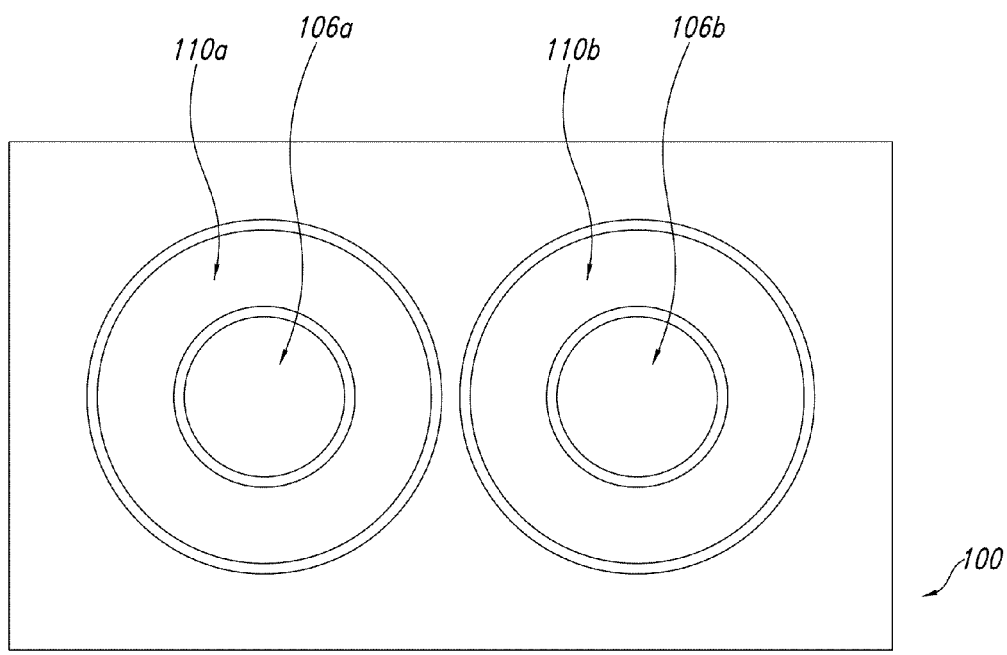
FIG. 2 is a top, schematic view illustrating one side of the sputtering system of FIG. 1, according to one embodiment.

The first sputtering assembly 102a includes a first anode 106a and a first cathode 108a. As illustrated, the first anode 106a is positioned along a central axis of the first sputtering assembly 102a. The first cathode 108a is arranged peripherally about the first anode 106a and is electrically coupled to the first target 110a. In such an embodiment, positive ions created in the sputtering system 100 are attracted to and bombard the surface of the first target 110a, and material is thus ejected from the first target 110a during the sputtering operation to be deposited onto the first disk 104a. The first anode 106a is generally circular when viewed from the top (as visible in FIG. 2), while the first cathode 108a is generally disk-shaped. Of course, the geometry and polarity of these portions of the first sputtering assembly 102a may be changed in different embodiments to achieve different sputtering characteristics. For example, in one embodiment, the first anode 106a may be arranged peripherally about the first cathode 108a and may be coupled to the first target 110a.

In one embodiment, the first anode 106a is electrically coupled to ground, and the first cathode 108a is configured to reach an electrical potential of less than −300 V. For example, the first cathode 108a may be kept at an electrical potential of approximately −500 V. In other embodiments, any of a variety of electrical potentials may be employed for the first anode 106a and the first cathode 108a to achieve the desired sputtering characteristics.

In one embodiment, the other anodes 106b-d and cathodes 108b-d may be configured substantially similarly to the first anode 106a and first cathode 108a. Thus, in one embodiment, the above description of the first anode 106a and the first cathode 108a may be applied equally to any of the anodes 106b-d and cathodes 108b-d. In other embodiments, different geometries and electrical potentials may be used for the anodes 106 and cathodes 108 in the different sputtering assemblies 102 (e.g., in order to sputter different materials onto the disks 104a, b).

The first and second targets 110a, b may comprise any of a variety of materials. In one embodiment, the first and second targets 110a, b include magnetic alloys (e.g., Cobalt, Iron, Nickel), and may be used to sputter such magnetic alloys onto the first and second disks 104a, b. In other embodiments, the first and second targets 110a, b may include non-magnetic materials (e.g., Chrome, Carbon). Each of the targets 110a, b may be substantially disc-shaped in order to facilitate relatively homogeneous sputtering onto the disks 104a, b. The geometry of the first and second targets 110a, b may be better understood with reference to FIG. 2, which shows a top view of the first and second sputtering assemblies 102a, b. In one embodiment, the targets 110a, b each have a diameter greater than that of the first and second disks 104a, b. In other embodiments, other geometries for the first and second targets 110a, b may be used to achieve different sputtering characteristics.

The first target 110a may be electrically coupled to the first cathode 108a, and the second target 110b may be electrically coupled to the second cathode 108b. As illustrated in FIG. 1, the first target 110a may be received by and positioned in direct contact with the first cathode 108a. When a new target is needed, the first target 110a may be removed and replaced with a fresh target for additional sputtering. In other embodiments, other structures may be used to electrically couple the first target 110a to the first cathode 108a. Similar structures may also be used to electrically couple the second target 110b to the second cathode 108b.

In one embodiment, the third and fourth targets 110c, d may be configured substantially similarly to the first and second targets 110a, b. Thus, in one embodiment, the above description of the first and second targets 110a, b may be applied equally to any of the targets 110c, d. In other embodiments, different geometries, materials and electrical coupling structures may be used for the targets 110 of the different sputtering assemblies 102 (e.g., in order to sputter different materials onto the disks 104a, b).

As illustrated, the first sputtering assembly 102a is positioned proximate the second sputtering assembly 102b. For example, in one embodiment, the first target 110a and the second target 110b may be positioned such that a central axis of the first target 110a is spaced apart from a central axis of the second target 110b by approximately 15 cm. Such spacing may be used, for example, when sputtering to 95 mm media used in magnetic disk drives. In other embodiments, the first target 110a and the second target 110b may be positioned closer or farther away, depending upon the size of the disks 104a, b and overall geometry of the sputtering system 100.

In one embodiment, the first cathode 108a may be positioned less than 3 cm apart from the second cathode 108b. Indeed, the first cathode 108a may be positioned less than 1.5 cm apart from the second cathode 108b. In order to bring these highly charged components so close together, the sputtering system 100 may further comprise a vacuum insulator 116a positioned between the first cathode 108a and the second cathode 108b. In one embodiment, the vacuum insulator 116a may comprise TEFLON®, manufactured and sold by DuPont. In other embodiments, the vacuum insulator 116a may comprise DELRIN®, also manufactured and sold by DuPont. In some embodiments, the sputtering system 100 may further comprise a first anode vacuum insulator 118a positioned between the first anode 106a and the first cathode 108a, as well as a second anode vacuum insulator 118b positioned between the second anode 106b and the second cathode 108b. The first and second anode vacuum insulators 118a, b may be formed from the same materials as the vacuum insulator 116a.

The geometry of and spacing between the first and second sputtering assemblies 102a, b may be similar to the geometry and spacing of the third and fourth sputtering assemblies 102c, d. Thus, in one embodiment, the above description of the first and second sputtering assemblies 102a, b may be applied equally to the third and fourth sputtering assemblies 102c, d. For example, the sputtering system 100 may include a second vacuum insulator 116b positioned between the third and fourth cathodes 108c, d. The third and fourth sputtering assemblies 102c, d may also include respective third and fourth anode vacuum insulators 118c, d.

The sputtering system 100 may further include a plurality of magnetic rings 112a-d to enable magnetron sputtering. The geometry and configuration of these magnetic rings 112a-d may be better understood with reference to FIGS. 3-5, which illustrate exemplary magnetic rings 112 separated from the other components of the sputtering system 100.

Figure 3:
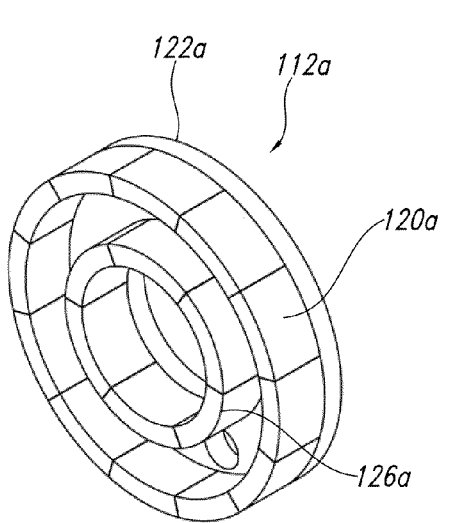
FIG. 3 is a perspective, schematic view illustrating an exemplary magnetic ring for use in the sputtering system of FIG. 1, according to one embodiment.
Figure 4:
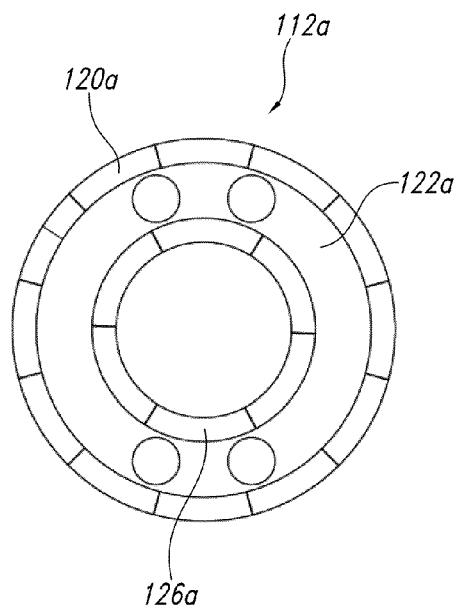
FIG. 4 is a top, schematic view illustrating the exemplary magnetic ring of FIG. 3, according to one embodiment.
Figure 5:
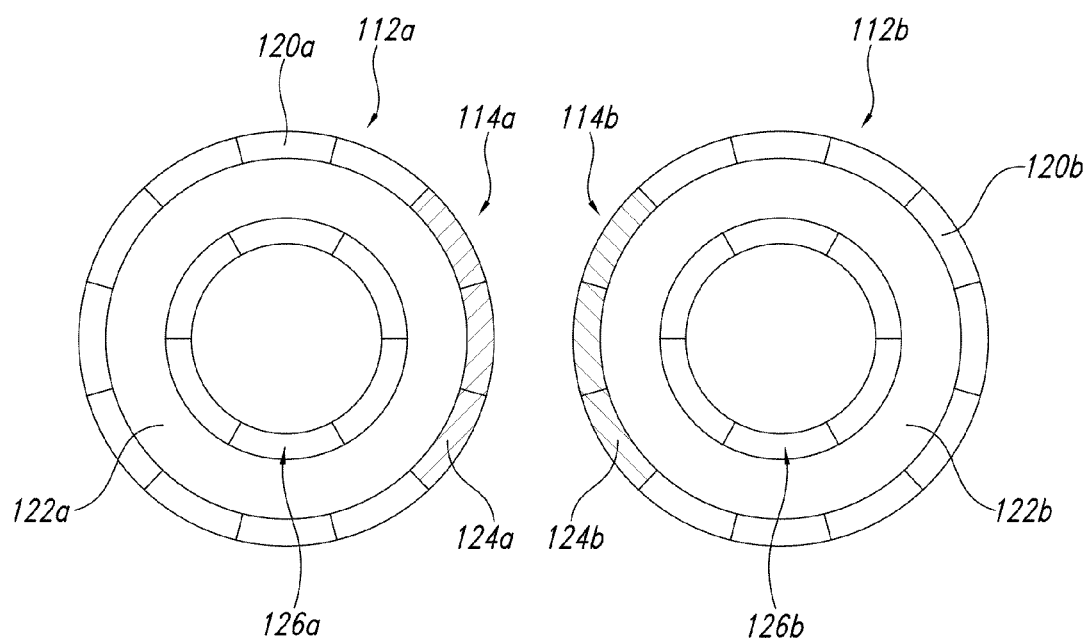
FIG. 5 is a top, schematic view illustrating exemplary magnetic rings for use in the sputtering system of FIG. 1, with shaded regions of lower relative magnetic strength, according to one embodiment.

In one embodiment, the first magnetic ring 112a includes a first plurality of permanent magnets 120a, and the second magnetic ring 112b includes a second plurality of permanent magnets 120b (as illustrated in FIGS. 3-5). These permanent magnets 120a, b may be arranged to form substantially continuous magnetic rings 112a, b. That is, in one embodiment, each of the first plurality of permanent magnets 120a may be in mating contact with adjacent permanent magnets 120a to either side, as shown in FIG. 5. In other embodiments, the first magnetic ring 112a may not be continuous but may include one or more gaps in the ring, where the first plurality of permanent magnets 120a are not in close contact. In addition, although illustrated as a perfect circle, the first and second magnetic rings 112a, b need not be perfectly circular. For example, in one embodiment, each of the magnetic rings 112a, b may be generally elliptical.

As illustrated, in one embodiment, the first plurality of permanent magnets 120a may be affixed to a first carrying plate 122a to form the first magnetic ring 112a. Similarly, the second plurality of permanent magnets 120b may be affixed to a second carrying plate 122b to form the second magnetic ring 112b. The permanent magnets 120a, b may be affixed to the carrying plates 122a, b using adhesive or other mechanical fasteners. In other embodiments, the first carrying plates 122a may be omitted, and the first plurality of permanent magnets 120a may be affixed one to the other to form the first magnetic ring 112a. Other structures for forming the magnetic rings 112a, b may also be used.

The first and second plurality of permanent magnets 120a, b may comprise any of a variety of magnetic materials. In one embodiment, the permanent magnets 120a, b comprise a magnetic alloy including Neodymium, Iron and Boron in any of a variety of ratios. In another embodiment, a magnetic alloy of Samarium and Cobalt may be used.

Of course, in other embodiments, the first and second magnetic rings 112a, b may be formed from other magnetic structures. In one embodiment, a unitary ring of permanent magnetic material is used to form each of the first and second magnetic rings 112a, b. In another embodiment, the first and second magnetic rings 112a, b may each comprise one or more electromagnets.

In one embodiment, as illustrated in FIG. 5, the first and second magnetic rings 112a, b include regions 114a, b of lower relative magnetic strength. If the first and second magnetic rings 112a, b comprise corresponding pluralities of permanent magnets 120a, b, the first region 114a of lower relative magnetic strength may include at least one permanent magnet 124a (shaded in FIG. 5) that is weaker than other magnets of the first plurality of permanent magnets 120a. Similarly, the second region 114b of lower relative magnetic strength may include at least one permanent magnet 124b that is weaker than other magnets of the second plurality of magnets 120b. In the absence of these weaker regions 114a, b, the magnetic field of the first magnetic ring 112a might be asymmetrical, distorted by a bucking effect caused by the interaction between magnetic fields generated by the first and second magnetic rings 112a, b. Similarly, the magnetic field of the second magnetic ring 112b might also be asymmetrical. Thus, the weakened regions 114a, b may be configured to compensate for the bucking effect, and allow the magnetic fields of each of the magnetic rings 112a, b to be made substantially symmetrical.

In one embodiment, the weaker permanent magnets 124a, b may be less than 10% weaker than the other permanent magnets 120a, b. In another embodiment, the weaker permanent magnets 124a, b may be approximately 5% weaker than the other permanent magnets 120a, b. In still another embodiment, the weaker permanent magnets 124a, b may be at least 1% weaker than the other permanent magnets 120a, b. Although three permanent magnets 124a, b of each magnetic ring 112a, b are illustrated as weaker in FIG. 5, more or fewer permanent magnets may be made weaker in different embodiments to achieve the desired magnetic fields.

In other embodiments, different structures and/or magnetic configurations may be used to form the regions 114a, b of lower relative magnetic strength. For example, in one embodiment, regions of the magnetic rings 112a, b may be shunted in order to modify the shape of the magnetic fields generated by the magnetic rings 112a, b and thereby decrease the effective magnetic strength of such regions 114a, b. In other embodiments, additional, repelling magnets may be arranged relative to the magnetic rings 112a, b in order to modify the shape of the magnetic fields generated by the magnetic rings 112a, b. In still other embodiments, a location or size of one or more of the permanent magnets 120a, b may be modified in order to achieve a lower relative magnetic strength.

In one embodiment, the first sputtering assembly 102a further includes a first inner magnetic ring 126a concentric with and positioned within the first magnetic ring 112a, and the second sputtering assembly 102b includes a second inner magnetic ring 126b concentric with and positioned within the second magnetic ring 112b. These pairs of magnetic rings 112a, b, 126a, b may be configured to create magnetic fields that improve efficiency during magnetron sputtering. In one embodiment, the inner magnetic rings 126a, b comprise permanent magnets configured similarly to the permanent magnets 120a, b that form the magnetic rings 112a, b. In other embodiments, different magnetic structures may be used to form the inner magnetic rings 126a, b. In one embodiment, the first magnetic ring 112a is oriented such that a north pole of the first magnetic ring 112a is configured to face the first disk 104a, and the first inner magnetic ring 126a is oriented such that a south pole is configured to face the first disk 104a. The second magnetic ring 112b and the second inner magnetic ring 126b may be oriented similarly. Of course, in other embodiments, alternative orientations for the magnetic rings 112a, b, 126a, b may be employed.

The other magnetic rings 112c, d and inner magnetic rings 126c, d may be configured substantially similarly to the first and second magnetic rings 112a, b and first and second inner magnetic rings 126a, b. Thus, in one embodiment, the above description of the first and second magnetic rings 112a, b and the first and second inner magnetic rings 126a, b may be applied equally to the other magnetic rings 112c, d and inner magnetic rings 126c, d. In other embodiments, different geometries and structures may be used for the magnetic rings 112c, d and inner magnetic rings 126c, d in the other sputtering assemblies 102c, d.

Figure 6:
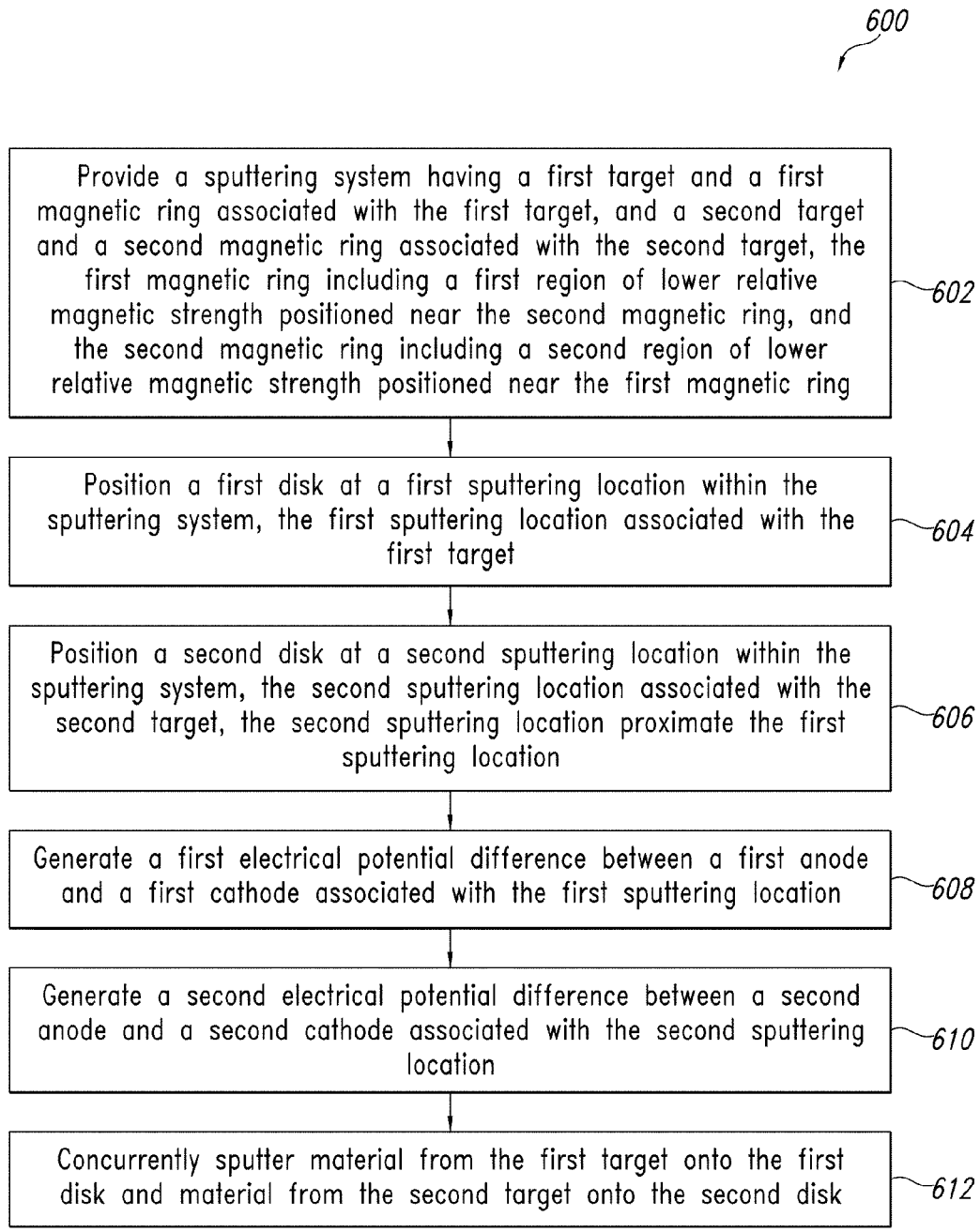
FIG. 6 illustrates a flow chart for a method of manufacturing magnetic disks, according to one embodiment.

FIG. 6 illustrates a flow chart for a method 600 of manufacturing magnetic disks, according to one illustrated embodiment. This method 600 will be discussed in the context of the sputtering system 100 of FIGS. 1-5. However, the acts disclosed herein may be executed using any sputtering system, in accordance with the described method. Moreover, although described in the context of manufacturing magnetic disks, the acts of method 600 may also be carried out in other contexts. For example, acts of method 600 may be carried out to manufacture optical or magneto-optical disks.

As described herein, many of the acts comprising the method 600 may be orchestrated by a processor according to an automatic manufacturing algorithm, based at least in part on computer-readable instructions stored in computer-readable memory and executable by the processor. Of course, a manual implementation of one or more acts of the method 600 may also be employed.

At act 602, a sputtering system 100 is provided. The sputtering system 100 has a first target 110a and a first magnetic ring 112a associated with the first target 110a, and a second target 110b and a second magnetic ring 112b associated with the second target 110b. The first magnetic ring 112a includes a first region 114a of lower relative magnetic strength positioned near the second magnetic ring 112b, and the second magnetic ring 112b includes a second region 114b of lower relative magnetic strength positioned near the first magnetic ring 112a. In one embodiment, the sputtering system 100 may comprise one among a number of sputtering systems used in the manufacture of magnetic disks 104a, b.

At act 604, a first disk 104a is positioned at a first sputtering location 128a within the sputtering system 100, the first sputtering location 128a associated with the first target 110a. At act 606, a second disk 104b is positioned at a second sputtering location 128b within the sputtering system 100, the second sputtering locations 128b associated with the second target 110b, the second sputtering location 128b proximate the first sputtering location 128a. In one embodiment, the first and second disks 104a, b may be positioned at these sputtering locations 128a, b using one or more movable disk carriers. In another embodiment, the first and second disks 104a, b may be loaded onto respective holders at the sputtering locations 128a, b using a robotic arm. In other embodiments, other mechanisms (manual or automatic) may be used to position the first and second disks 104a, b at the sputtering locations 128a, b. Acts 604 and 606 may be carried out substantially concurrently or at different times.

At act 608, a first electrical potential difference is generated between a first anode 106a and a first cathode 108a associated with the first sputtering location 128a, and, at act 610, a second electrical potential difference is generated between a second anode 106b and a second cathode 108b associated with the second sputtering location 128b. As described above, in one embodiment, generating the first electrical potential difference may include bringing the first anode 106a to a ground potential and bringing the first cathode 108a to a potential of less than −300V. The second electrical potential difference may be generated similarly. In other embodiments, different electrical potential differences may be generated.

At act 612, material is concurrently sputtered from the first target 110a onto the first disk 104a, and from the second target 110b onto the second disk 104b. Thus, in one embodiment, the sputtering system 100 may enable increased throughput by sputtering to multiple disks concurrently.

In some embodiments, as illustrated in FIG. 1, the method 600 may further comprise concurrently sputtering material from a third target 110c onto an opposite surface of the first disk 104a, and from a fourth target 110d onto an opposite surface of the second disk 104b. These acts may be executed concurrently with act 612.

In one embodiment, the method 600 may further comprise eroding a first approximately circular race track pattern in the first target 110a and a second approximately circular race track pattern in the second target 110b while concurrently sputtering. It may be understood that these approximately circular race track patterns are indicative of the pattern of material that is ejected from the targets 110a, b during the sputtering process. By keeping the race track patterns approximately circular (as opposed to elliptical), a more even deposition of material across the disks 104a, b may be possible. In one embodiment, the approximately circular race track patterns may be formed such that, even if slightly elliptical, the major axis is not more than 20% larger than the minor axis. In another embodiment, the approximately circular race track patterns may be formed such that, even if slightly elliptical, the major axis is not more than 10% larger than the minor axis. In other embodiments, even tighter tolerances may be required. The approximately circular race track patterns may be achieved based at least in part on the regions 114a, b of lower relative magnetic strength, which may compensate for the bucking effect between the magnetic rings 112a, b, and allow the effective magnetic fields formed in part by each of the magnetic rings 112a, b to be substantially symmetrical about their respective central axes.

The foregoing detailed description has set forth various embodiments of the systems and/or processes via the use of block diagrams, schematics, and examples. Insofar as such block diagrams, schematics, and examples contain one or more functions and/or operations, each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, the embodiments disclosed herein, in whole or in part, can be equivalently implemented in standard integrated circuits, as one or more programs executed by one or more processors, as one or more programs executed by one or more controllers (e.g., microcontrollers), as firmware, or as virtually any combination thereof.

I claim:

1. A sputtering system, comprising:
a first sputtering assembly configured to sputter material onto a first disk, the first sputtering assembly including:
a first anode;
a first cathode;
a first target electrically coupled to at least one of the first anode and the first cathode; and
a first magnetic ring; and
a second sputtering assembly configured to sputter material onto a second disk, the second sputtering assembly positioned proximate to the first sputtering assembly and including:
a second anode;
a second cathode;
a second target electrically coupled to at least one of the second anode and the second cathode; and
a second magnetic ring;
wherein the first magnetic ring includes a first region of lower relative magnetic strength than other portions of the first magnetic ring, so that the first region of the first magnetic ring is positioned near the second magnetic ring, and the second magnetic ring includes a second region of lower relative magnetic strength than other portions of the second magnetic ring, so that the second region of the second magnetic ring is positioned near the first magnetic ring.

2. The sputtering system of claim 1, wherein the first disk and the second disk are positioned such that a center axis of the first disk is approximately 15 cm apart from a center axis of the second disk.

3. The sputtering system of claim 1, wherein the first anode is electrically coupled to ground and the first cathode is configured to reach an electrical potential of less than −300 V.

4. The sputtering system of claim 1, wherein the first target and the second target each includes a magnetic alloy.

5. The sputtering system of claim 1, wherein the first target and the second target each includes a non-magnetic materials material.

6. The sputtering system of claim 1, wherein the first target is electrically coupled to the first cathode, and the second target is electrically coupled to the second cathode.

7. The sputtering system of claim 1, wherein the first cathode is less than 3 cm apart from the second cathode.

8. The sputtering system of claim 7, wherein the first cathode is less than 1.5 cm apart from the second cathode.

9. The sputtering system of claim 1, wherein the first magnetic ring includes a first plurality of permanent magnets, and the second magnetic ring includes a second plurality of permanent magnets.

10. The sputtering system of claim 9, wherein the first region of lower relative magnetic strength includes at least one permanent magnet less than 10% weaker than other magnets of the first plurality of permanent magnets, and the second region of lower relative magnetic strength includes at least one permanent magnet less than 10% weaker than other magnets of the second plurality of permanent magnets.

11. The sputtering system of claim 10, wherein the first region of lower relative magnetic strength includes at least one permanent magnet approximately 5% weaker than other magnets of the first plurality of permanent magnets, and the second region of lower relative magnetic strength includes at least one permanent magnet approximately 5% weaker than other magnets of the second plurality of permanent magnets.

12. The sputtering system of claim 1, wherein the first sputtering assembly further includes a first inner magnetic ring concentric with and positioned within the first magnetic ring, and the second sputtering assembly further includes a second inner magnetic ring concentric with and positioned within the second magnetic ring.

13. The sputtering system of claim 12, wherein the first magnetic ring is oriented such that a north pole is configured to face the first disk, and the first inner magnetic ring is oriented such that a south pole is configured to face the first disk.

14. The sputtering system of claim 1, further comprising:
a third sputtering assembly configured to sputter material onto the first disk, the third sputtering assembly positioned opposite the first sputtering assembly and including:
a third anode;
a third cathode;
a third target electrically coupled to at least one of the third anode and the third cathode; and
a third magnetic ring; and
a fourth sputtering assembly configured to sputter material onto the second disk, the fourth sputtering assembly positioned opposite the second sputtering assembly and including:
a fourth anode;
a fourth cathode;
a fourth target electrically coupled to at least one of the fourth anode and the fourth cathode; and
a fourth magnetic ring;
wherein the third magnetic ring includes a third region of lower relative magnetic strength than other portions of the third magnetic ring, so that the third region of the third magnetic ring is positioned near the fourth magnetic ring and the fourth magnetic ring includes a fourth region of lower relative magnetic strength than other portions of the fourth magnetic ring, so that the fourth region of the fourth magnetic ring is positioned near the third magnetic ring.

15. The sputtering system of claim 1, further comprising a vacuum insulator positioned between the first cathode and the second cathode.

* * * * *